(12) United States Patent
Wang

(10) Patent No.: US 11,403,981 B2
(45) Date of Patent: Aug. 2, 2022

(54) SHIFT REGISTER UNIT, GATE DRIVING CIRCUIT, DISPLAY APPARATUS AND CONTROL METHOD THEREOF

(71) Applicants: BEIJING BOE DISPLAY TECHNOLOGY CO., LTD., Beijing (CN); BOE TECHNOLOGY GROUP CO., LTD., Beijing (CN)

(72) Inventor: Zheng Wang, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 668 days.

(21) Appl. No.: 16/339,140

(22) PCT Filed: Sep. 29, 2018

(86) PCT No.: PCT/CN2018/108758
§ 371 (c)(1),
(2) Date: Apr. 3, 2019

(87) PCT Pub. No.: WO2019/134413
PCT Pub. Date: Jul. 11, 2019

(65) Prior Publication Data
US 2021/0343208 A1 Nov. 4, 2021

(30) Foreign Application Priority Data
Jan. 2, 2018 (CN) .......................... 201810003872.1

(51) Int. Cl.
*G09G 3/20* (2006.01)
*G11C 19/28* (2006.01)

(52) U.S. Cl.
CPC ............... *G09G 3/20* (2013.01); *G11C 19/28* (2013.01); *G09G 2310/0286* (2013.01); *G09G 2310/08* (2013.01)

(58) Field of Classification Search
CPC .. G06G 3/20; G11C 19/28; G09G 2310/0286; G09G 2310/08
See application file for complete search history.

(56) References Cited

U.S. PATENT DOCUMENTS

2006/0267876 A1* 11/2006 Jang ..................... G09G 3/2965
345/68
2008/0219401 A1* 9/2008 Tobita .................. H03K 19/096
377/79

(Continued)

FOREIGN PATENT DOCUMENTS

CN 101383133 A 3/2009
CN 101710478 A 5/2010

(Continued)

OTHER PUBLICATIONS

International Search Report and Written Opinion in corresponding International Patent Application No. PCT/CN2018/108758 dated Jan. 4, 2019. 18 pages.

(Continued)

*Primary Examiner* — Sejoon Ahn
(74) *Attorney, Agent, or Firm* — Leason Ellis LLP

(57) ABSTRACT

Provided in the present disclosure are a shift register unit, a gate driving circuit, a display apparatus and a control method for the display apparatus. The shift register unit includes: an input sub-circuit, having a first terminal connected to a first signal line, a second terminal connected to a pull-up node, and a third terminal connected to an input signal line; an output sub-circuit, configured to output a clock signal inputted by the clock signal line to the output terminal under the control of the pull-up node; a shutdown (Continued)

control sub-circuit, having a first terminal connected to the output terminal, a second terminal connected to a first shutdown control signal line, and a third terminal connected to a second shutdown control signal line, wherein the shutdown control sub-circuit is configured to output a second shutdown control signal to the output terminal under a control of a first shutdown control signal.

17 Claims, 13 Drawing Sheets

(56) References Cited

U.S. PATENT DOCUMENTS

| | | |
|---|---|---|
| 2008/0238852 A1 | 10/2008 | Tsai |
| 2015/0279288 A1* | 10/2015 | Dai .................. G02F 1/13306 345/690 |
| 2018/0047751 A1* | 2/2018 | Xiao .................. G09G 3/3659 |
| 2021/0287591 A1* | 9/2021 | Qing .................. G11C 19/28 |

FOREIGN PATENT DOCUMENTS

| | | |
|---|---|---|
| CN | 104766586 | 7/2015 |
| CN | 106328084 A | 1/2017 |
| CN | 106486085 A | 3/2017 |
| CN | 107193168 A | 9/2017 |
| CN | 107967889 A | 4/2018 |

OTHER PUBLICATIONS

Chinese Office Action dated Jun. 18, 2020 corresponding to Chinese Patent Application No. 2018100003872.1, 11 pages.

* cited by examiner

SHIFT REGISTER UNIT, GATE DRIVING CIRCUIT, DISPLAY APPARATUS AND CONTROL METHOD THEREOF

CROSS-REFERENCE TO RELATED APPLICATION

This application is a U.S. National Stage Application under 35 U.S.C. § 371 of International Patent Application No. PCT/CN2018/108758, filed Sep. 29, 2018, which claims the benefit of priority of Chinese patent application No. 201810003872.1 filed on Jan. 2, 2018, both of which are incorporated by reference in their entireties as a part of the present application.

TECHNICAL FIELD

The present disclosure relates to a shift register unit, a gate driving circuit comprising the shift register unit, a display apparatus and a control method thereof.

BACKGROUND

In the use of a flat panel display, there would be always actions of powering on and shutting down. Many displays that adopt a gate-on-array (GOA) structure are lack of a function of initializing circuits and the panel upon powering on and shutting down. As a result, the actions of powering on and shutting down would bring much picture badness, such as flicker, afterimages, and linear defects, etc. Also, there may be displays that adopt a gate-on (Xon) technique. The Xon technique refers to pull up all signal voltages within a short time after shutdown, and all gates output simultaneously, to achieve the function of initializing the pixel voltages. However, Xon does not have any effect on the initialization of the gate array, and voltages at key node positions within the gate array can be initialized by combining with the specific structure of the gate array.

SUMMARY

In order to solve the above problem, the present disclosure provides a new type of design of the shift register unit, i.e., adding an initialization function for the gate on array structure upon powering on and shutting down on the original structure, so that the gate on array structure can keep normal function of the circuits during the power on and power off periods upon powering on and shutting down. The circuits can keep normal function, and the stability and lifetime of the product can be improved.

According to one aspect of the present disclosure, there is provided a shift register unit, comprising: an input sub-circuit, having a first terminal connected to a first signal line (Vdd), a second terminal connected to a pull-up node (PU), and a third terminal connected to an input signal line; an output sub-circuit, having a first terminal connected to the pull-up node (PU), a second terminal connected to a clock signal line (CLK), and a third terminal connected to an output terminal, and configured to output a clock signal of the clock signal line (CLK) to the output terminal under a control of the pull-up node (PU); a shutdown control sub-circuit, having a first terminal connected to the output terminal, a second terminal connected to a first shutdown control signal line, and a third terminal connected to a second shutdown control signal line, wherein the shutdown control sub-circuit is configured to input a second shutdown control signal inputted by the second shutdown control signal line to the output terminal under a control of a first shutdown control signal.

In one embodiment, in response to a shutdown signal, a potential of the first signal line is discharged to a zero potential, the first shutdown control signal line is pulled up, and controls the shutdown control sub-circuit to output the second shutdown control signal inputted by the second shutdown control signal line to the output terminal, wherein a potential of the second shutdown control signal is discharged to a zero potential after being pulled up.

In one embodiment, the first shutdown control signal line or the second shutdown control signal line is a clock signal line.

In one embodiment, the shift register unit further comprises: a pull-down control sub-circuit, having a first terminal connected to the pull-up node (PU), a second terminal connected to a second signal line (GCH1, GCH2), and a third terminal connected to a third signal line (VSS), and configured to control a level of a pull-down node (PD1/PD2) according to a level of the pull-up node (PU), a first power supply signal inputted by the second signal line (GCH1, GCH2) and a third power supply signal inputted by the third signal line (VSS); a pull-down sub-circuit, having a first terminal connected to the pull-down node (PD1/PD2), a second terminal connected to the pull-up node (PU), a third terminal connected to the output terminal, and a fourth terminal connected to the third signal line (VSS), and configured to pull down levels of the pull-up node (PU) and the output terminal to the third power supply signal of the third signal line (VSS) under the control of the pull-down node (PD1/PD2); a reset sub-circuit, having a first terminal connected to a reset signal line, a second terminal connected to the pull-up node (PU), and a third terminal connected to the third signal line (VSS), and configured to pull down the pull-up node (PU) to the third power supply signal of the third signal line (VSS) under a control of the reset signal line; wherein in response to the shutdown signal, a potential of the third signal line is discharged to a zero potential.

In one embodiment, the shutdown control sub-circuit comprises a shutdown control transistor (T16), having a gate connected to the first shutdown control signal line, a first electrode connected to the output terminal, and a second electrode connected to the second shutdown control signal line.

In one embodiment, inputting a second shutdown control signal inputted by the second shutdown control signal line to the output terminal under the control of a first shutdown control signal comprises: applying a turn-on signal to the first shutdown control signal line, so that the shutdown control transistor is turned on, and the potential of the output terminal is pulled up to a potential of the second shutdown control signal line.

In one embodiment, the input sub-circuit comprises an input transistor (T1), wherein a gate of the input transistor is connected to an input signal line, a first electrode thereof is connected to the first signal line, and a second electrode thereof is connected to the pull-up node (PU); the output sub-circuit comprises an output transistor (T3) and an output capacitor (C), wherein a gate of the output transistor is connected with a first terminal of the output capacitor and connected to the pull-up node, and a first terminal thereof is connected with a second terminal of the output capacitor and connected to the output terminal, and a second terminal thereof is connected to the clock signal line.

In one embodiment, the pull-down control sub-circuit comprises a first pull-down control transistor (T4/T6), a second pull-down control transistor (T5/T7), a third pull-down control transistor (T9/T11), and a fourth pull-down control transistor (T8/T10), wherein a gate of the first pull-down control transistor (T4/T6) is connected with a first electrode and connected to the second signal line, a second electrode thereof is connected to a gate of the second pull-down control transistor (T5/T7), and connected to a first electrode of the third pull-down control transistor (T9/T11); a first electrode of the second pull-down control transistor (T5/T7) is connected to the second signal line (GCH), a second electrode thereof is connected to the pull-down node (PD1/PD2); a gate of the third pull-down control transistor (T9/T11) is connected to the pull-up node (PU), and a second electrode thereof is connected to the third signal line (VSS); a gate of the fourth pull-down control transistor (T8/T10) is connected to the pull-up node (PU), a first electrode thereof is connected to the pull-down node (PD1/PD2), and a second electrode thereof is connected to the third signal line (VSS); the pull-down sub-circuit comprises a first pull-down transistor (T12/T14) and a second pull-down transistor (T13/T15), wherein a gate of the first pull-down transistor (T12/T14) is connected to the pull-down node (PD1/PD2), a first electrode thereof is connected to the output terminal, and a second electrode thereof is connected to the third signal line (VSS); a gate of the second pull-down transistor (T13/T15) is connected to the pull-down node (PD1/PD2), a first electrode thereof is connected to the pull-up node (PU), and second electrode thereof is connected to the third signal line (VSS); and the reset sub-circuit comprises a reset transistor (T2), wherein a gate of the reset transistor (T2) is connected to the reset signal line, a first electrode thereof is connected to the pull-up node (PU), and a second electrode thereof is connected to the third signal line (VSS).

According to another aspect of the present disclosure, there is proposed a gate driving circuit comprising the shift register unit as described above, comprising N stages of shift register units connected in cascades, the shift register unit being the shift register unit as described above, wherein an input terminal of an i-th stage of shift register unit is connected to an output terminal of an (i−1)-th stage of shift register unit, an output terminal of the i-th stage of shift register unit is connected to a reset terminal of the (i−1)-th stage of shift register unit, where N is an integer greater than 2, 1<i≤N; an input terminal of a first stage of shift register unit is connected to a frame input signal control line; a reset terminal of a N-th stage of shift register unit is connected to a frame reset signal control line.

According to another aspect of the present disclosure, there is proposed a display apparatus comprising the gate driving circuit as described above.

According to another aspect of the present disclosure, there is proposed a control method applicable to the display apparatus as described above, comprising: applying a first shutdown control signal serving as a turn-on signal to a first shutdown control signal line, in response to a shutdown signal of the display apparatus; and inputting a second shutdown control signal inputted by a second shutdown control signal line to an output terminal under the control of the first shutdown control signal.

In one embodiment, inputting a second shutdown control signal inputted by a second shutdown control signal line to an output terminal under the control of the first shutdown control signal comprises: turning on the shutdown control transistor under the control of the first shutdown control signal, and outputting the second shutdown control signal inputted by the second shutdown control signal line to the output terminal, wherein a potential of the second shutdown control signal is discharged to a zero potential after being pulled up.

By utilizing the shift register unit, the gate driving circuit and the driving method provided in the present disclosure, it is capable of making electric charges inside the shift register unit to be discharged timely after the shift register unit is shut down, so as to avoid screen abnormality from occurring at the next power-on time due to internal electric charges being not discharged timely.

BRIEF DESCRIPTION OF THE DRAWINGS

In order to describe technical solutions of embodiments of the present disclosure, accompanying figures that need to be used in description of the embodiments will be introduced briefly. Obviously, the accompanying figures in the following description are just some embodiments of the present disclosure. For those ordinary skilled in the art, other figures can also be obtained from these accompany figures without making any inventive labor. The following figures are not scaled and drawn purposely according to the actual dimensions, because the key point is to show the substance and spirit of the present disclosure.

DETAILED DESCRIPTION

Technical solutions in embodiments of the present disclosure will be described below clearly and completely by combining with accompanying figures. Obviously, the embodiments described below are just a part of embodiments of the present disclosure, but not all the embodiments. Based on the embodiments of the present disclosure, all the other embodiments obtained by those ordinary skilled in the art without paying any inventive labor also fall into the scope sought for protection in the present disclosure.

"First", "second" and similar words used in the present disclosure do not indicate any sequence, quantity or importance, but they are just used to distinguish different components. Also, "include", "comprise" and other similar words mean that an element or an object appearing prior to the word contains an element or an object or its equivalent listed subsequent to the word, but does not exclude other elements or objects. "Connect", "connected to" and other similar words are not limited to physical or mechanical connection, but can comprise electrical connection, regardless of direct connection or indirect connection. "Up", "down", "left", "right" and so on are used to only indicate a relative position relationship. After an absolute position of a described object is changed, the relative position relationship is likely to be changed correspondingly.

Transistors adopted in all the embodiments of the present disclosure can be thin film transistors or field effect transistors or other devices having the same characteristics. In the present embodiment, connection manners of a drain and a source of each transistor can be exchanged with each other. Therefore, drains and sources of respective transistors in the embodiment of the present disclosure do not make any distinction. Herein, in order to distinct the two electrodes other than the gate of the transistor, one electrode is called as a drain, and another electrode is called as a source. Thin film transistors adopted in the embodiment of the present disclosure may be N-type transistors, or may be P-type transistors. In the embodiment of the present disclosure, when the N-type thin film transistor is adopted, its first electrode can be a source, and second electrode can be a drain. In the following embodiments, by taking the thin film transistor being the N-type transistor as an example, when the signal of the gate is a high level, the thin film transistor is turned on. It can be conceived that when the P-type transistor is adopted, it needs to adjust timings of drive signals correspondingly. Specific details are not described herein, but they shall be deemed as falling into the protection scope of the present disclosure.

Figure 1A:
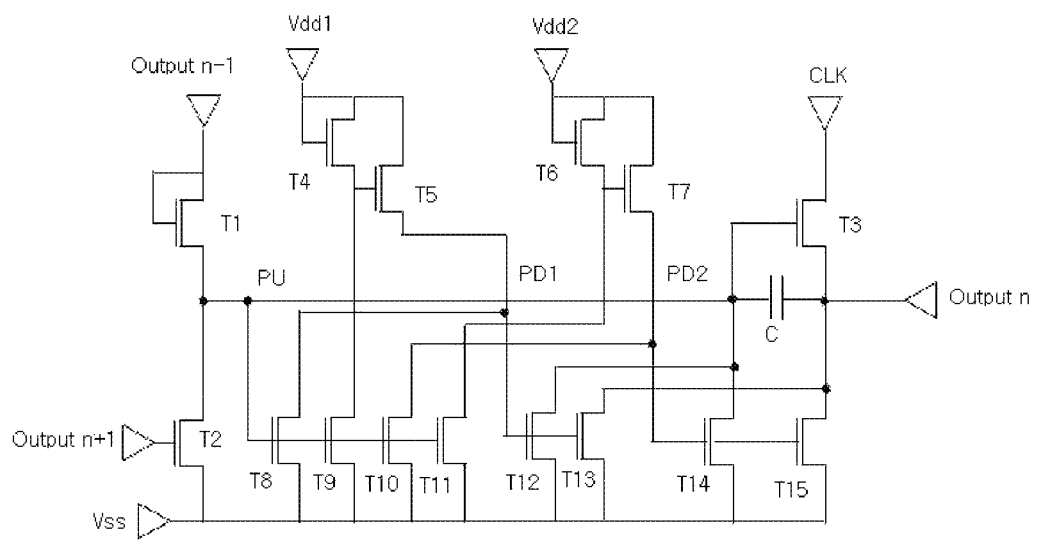
FIG. 1a is an exemplary circuit structure of a shift register unit according to the prior art.

FIG. 1a is an exemplary circuit structure of a shift register unit according to the prior art. According to the circuit structure shown in FIG. 1a, the shift register unit receives an input signal inputted by an input signal line Output-1, wherein the input signal line Output-1 is an output signal line of a previous stage of shift register unit in the gate driving circuit. For a first stage of shift register unit in the gate driving circuit, its input signal line is a frame input signal line STV. A level of a pull-up node PU can be pulled up by utilizing an input signal to charge an output capacitor C. Then, a clock signal is input via a clock signal line CLK. Since the level of the pull-up node PU is a high level and controls an output transistor T3 to be turned on at this time, an output signal of a present stage of shift register unit can be output at an output terminal Output n. When the pull-up node PU is pulled up to the high level, T8/T10 is turned on under the control of the pull-up node PU. Since a third signal line VSS is inputted a low level, a pull-down node PD1/PD2 is pulled down to the low level. For example, by designing a channel width-to-length ratio of T4/T6 and T9/T11, a gate of T5/T7 is made to be a low level when the pull-up node PU is a high level and controls T8/T10 and T9/T11 to be turned on, and at this time, T5/T7 is turned off, so that the pull-down node PD1/PD2 is pulled down to the low level via T8/T10. When the pull-up node PU is pulled down to the low level, T8/T10 and T9/T11 are turned off under the control of the node PU, so that the PD1/PD2 is pulled up to the high level under the control of Vdd1/Vdd2, and controls T12/T14 and T13/T15 to be turned on, thereby further maintaining the pull-up node PU at a low level. After the output terminal Output n outputs an output signal, the pull-up node PU can be reset by inputting a reset signal via a reset control line Output n+1. Herein, the reset control line Output+1 is an output signal line of a next stage of shift register unit in the gate driving circuit. For a last stage of shift register unit in the gate driving circuit, its reset control line is a frame reset signal line.

In the shift register unit as shown in FIG. 1a, T4/T6, T5/T7, T9/T11, T8/T10, T12/T14, T13/T15 and signal lines Vdd1/Vdd2 form two sets of circuit structures having a same structure. In the driving process of the shift register unit, the signal line Vdd1/Vdd2 is applied a driving signal (such as high level), alternatively, that is, when Vdd1 is input a high level, Vdd2 is input a low level; when Vdd1 is input a low level, Vdd2 is input a high level. The above control method makes that the above two sets of same circuits realize a same circuit control function alternatively, so as to prevent drift of electrical characteristics from occurring in the transistors because of being in an operating state constantly.

Figure 1B:
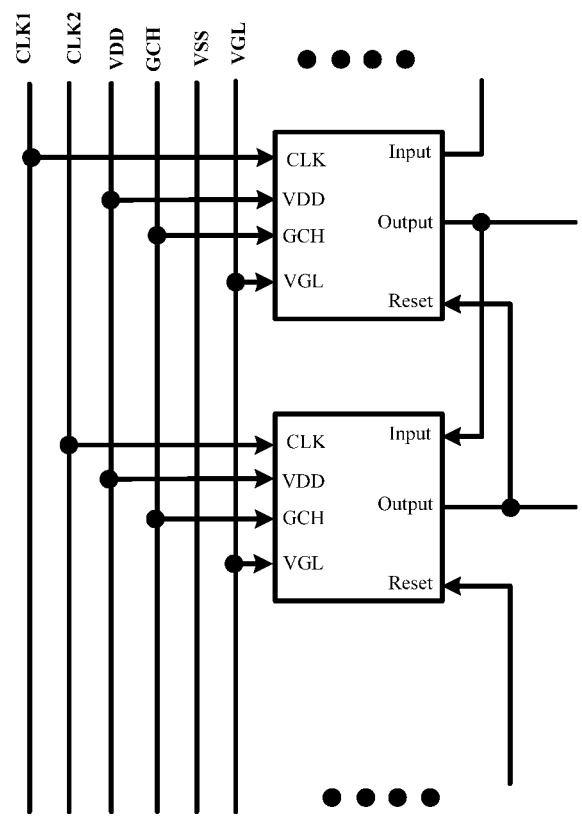
FIG. 1b is a schematic diagram of a gate driving circuit according to the prior art.

FIG. 1b is a structure of a gate driving circuit according to the prior art. As shown in FIG. 1b, herein, an output terminal OUTPUT of a first stage of shift register unit is connected to an input signal line Input of a second stage of shift register unit, an output terminal OUTPUT of a last stage of shift register unit is connected to a reset terminal RESET of a second stage from the end of shift register unit; except the first stage of shift register unit, an output terminal OUTPUT of each stage of shift register unit is further connected to a reset terminal RESET of a previous stage of shift register unit; except a last stage of shift register unit, the output terminal OUTPUT of each stage of shift register unit is further connected to an input signal line Input of a next stage of shift register unit, that is, for an N-th stage of shift register unit, its input signal line Input is connected to an output terminal Output of a (N−1)-th stage of shift register unit, and its reset terminal RESET is connected to an output terminal Output of a (N+1)-th stage of shift register unit. A clock signal line CLK of an odd-numbered stage of shift register unit is connected to a first clock signal line CLK1, a clock signal line CLK of an even-numbered stage of shift register unit is connected to a second clock signal line CLK2, wherein phases of the first clock signal CLK1 and the second clock signal CLK2 have a phase difference of 180 degrees and levels thereof are opposite. For example, the clock signal line CLK of first, third, fifth, seventh stages of shift register units is connected to the first clock signal line CLK1, and the clock signal line CLK of second, fourth, sixth, and eighth stages of shift register units is connected to the second clock signal line CLK2.

Figure 2:
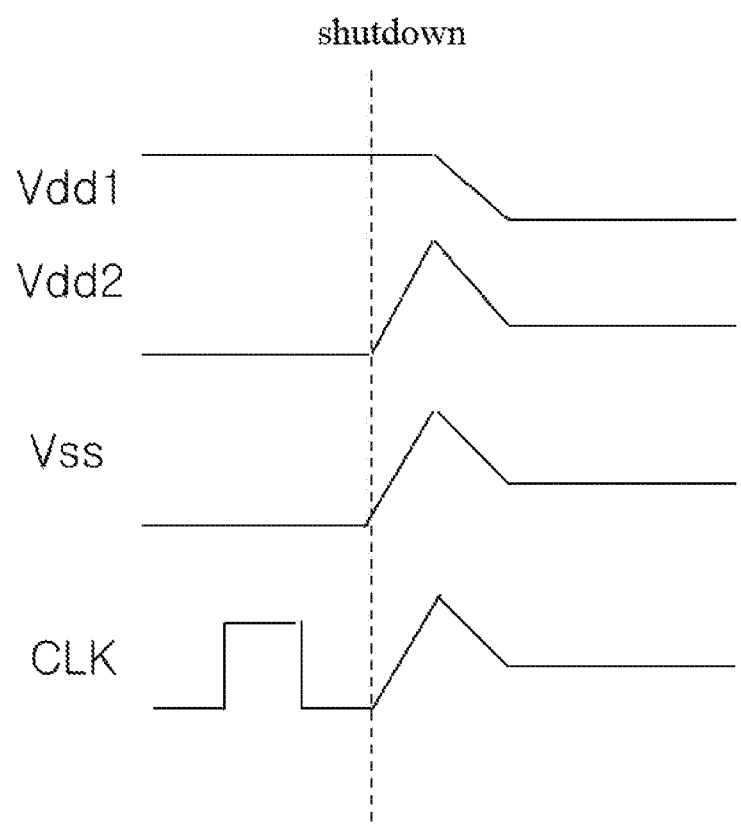
FIG. 2 is a shutdown timing diagram of a gate driving circuit according to the prior art.

FIG. 2 is a shutdown timing diagram of a gate driving circuit according to the prior art. According to the shutdown timing as shown in FIG. 2, after the shutdown program is activated, power supply signal lines Vdd1, Vdd2, Vss, and CLK connected to each stage of shift register unit are pulled up to a high level, so that all the transistors inside each stage of shift register unit are turned on, and each stage of shift register unit outputs a high level. Therefore, pixel voltages of pixel circuits connected to respective stages of shift register units can reach consistency after shutdown, so as to eliminate shutdown afterimages. Later, potentials of signal lines Vdd1, Vdd2, Vss, and CLK are gradually discharged from the high level to a zero potential.

However, shutdown modes in the prior art have defects. Vdd1, Vdd2, CLK and Vss are pulled up simultaneously, and are discharged slowly to the zero potential after a period of time. Therefore, the potential of the output terminal Output n of the shift register unit is high during the period of shutdown, and also potentials of both the pull-up node PU and the pull-down node PD are high. Since the pull-up-node PU is at one terminal of the output capacitor C, and the capacitor C has a maintenance effect, it is possible that electric charges at the pull-up node PU of a part of shift register units in the gate driving circuit are not discharged if the shift register unit is repowered on within a short period of time, i.e., the situation of the pull-up node PU being still at a high level. Therefore, in the process that the gate driving circuit drives the shift register unit progressively, if electric charges at the pull-up node PU in a part of shift register units are not discharged completely, it is likely to cause that the output transistor T3 in these shift register units are turned on in advance when the CLK signal comes, and thus multi-output screen abnormality phenomenon would occur.

Additionally, the potential of the pull-up node PU is at a high level within a certain period of time. If the shift register unit is repowered on before the electric charges of the pull-up node PU are discharged, the pull-up node PU would be continuously controlling the transistors T8, T9, T10, T11 to be turned on, and the transistors T5 and T7 maintain turned off all along. Therefore, the pull-down nodes PD1 and PD2 cannot be pulled up to the high level under the control of the input signals of the signal lines Vdd1,=and Vdd2. In this case, the potential of the pull-up node PU cannot be pulled down via the transistors T12 and T14, so that it is likely to cause the output transistors T3 of part of shift register units in the gate driving circuit to be turned on in advance, and thus screen abnormality occurs.

The major idea of the present disclosure is to make some modifications based on the existing circuit structures and add a shutdown control sub-circuit controlled by a first shutdown control signal line and/or second shutdown control signal line. In this way, when the pixel circuit is discharged in a shutdown phase, it is not necessary to pull up all the signal voltages, but only the first shutdown control signal and/or the second shutdown control signal is/are controlled. In this way, upon shutdown, the output signal of each stage of shift register unit can be pulled up to the high level by the shutdown control sub-circuit, and the function of discharging pixels is realized. Furthermore, when the output signal of the n-stage of shift register unit acts on output n−1 and output n+1 terminals of adjacent shift register units, the potential of the pull-up nodes PU of the adjacent shift register units can be controlled to be discharged to 0 along with the signals of the Vdd and Vss. In this way, at the time of the next shutdown, the potential of the pull-up node PU is very low, which can effectively prevent screen abnormality from occurring because the charges at the node PU are too late to be discharged.

Figure 3:
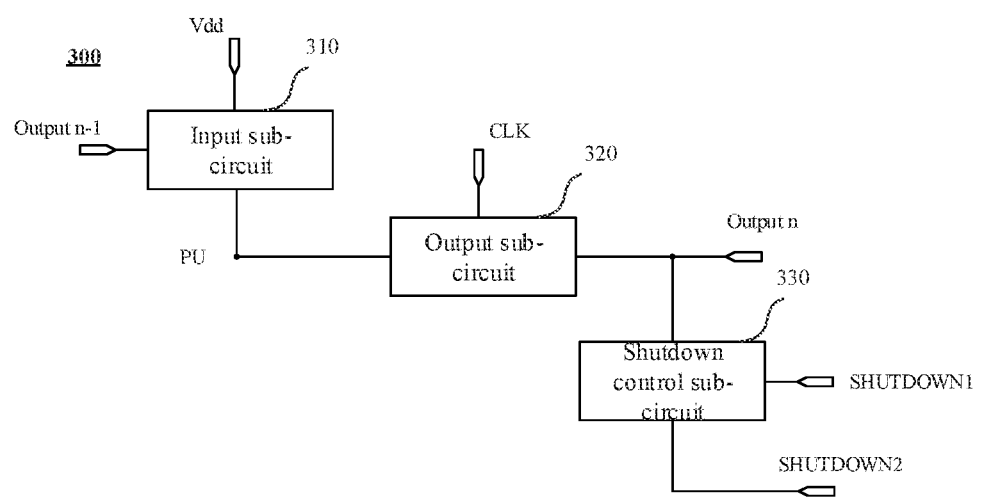
FIG. 3 is a schematic block diagram of a shift register unit according to some embodiments of the present disclosure.

FIG. 3 is a schematic block diagram of a shift register unit according to some embodiments of the present disclosure. As shown in FIG. 3, the shift register unit 300 comprises: an input sub-circuit 310, having a first terminal connected to the first signal line Vdd, and a second terminal connected to the pull-up node PU; an output sub-circuit 320, having a first terminal connected to the pull-up node PU, a second terminal connected to the clock signal line CLK, and a third terminal connected to the output terminal Output n, and configured to output the clock signal inputted by the clock signal terminal CLK to the output terminal under the control of the pull-up node PU; a shutdown control sub-circuit 330, having a first terminal connected to the output terminal, a second terminal connected to a first shutdown control signal line SHUTDOWN 1, and a third terminal connected to a second shutdown control signal line SHUTDOWN 2, wherein the shutdown control sub-circuit is configured to input the second shutdown control signal inputted by the second shutdown control signal line to the output terminal under the control of the first shutdown control signal.

Figure 4:
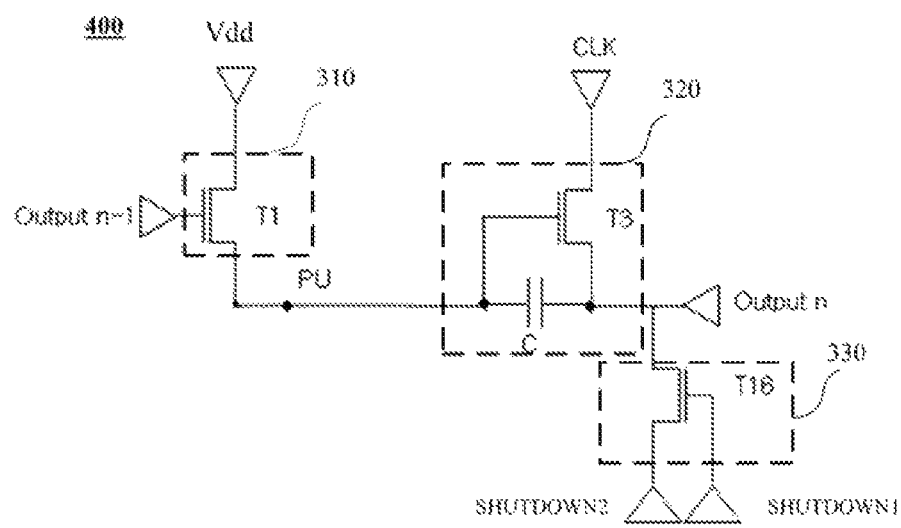
FIG. 4 is an exemplary circuit structure of a shift register unit according to some embodiments of the present disclosure.

FIG. 4 is an exemplary circuit structure of a shift register unit according to some embodiments of the present disclosure. The circuit structure of the shift register unit will be described in detail by combining with FIGS. 3 and 4.

As shown in FIG. 4, in one embodiment, the input sub-circuit 310 comprises an input transistor T1, wherein a gate of the input transistor T1 is connected to the input signal line output n−1, a first terminal thereof is connected to the first signal line Vdd, and a second terminal thereof is connected to the pull-up node PU; the output sub-circuit 320 comprises the output capacitor T3 and the output capacitor C, wherein a gate of the output transistor T3 is connected with the first terminal of the output capacitor C and connected to the pull-up node PU, a first terminal thereof is connected with the second terminal of the output capacitor C and connected to the output terminal Output n, and a second terminal thereof is connected to the clock signal line CLK. The shutdown control sub-circuit 330 comprises a shutdown control transistor T16, wherein a gate of the shutdown control transistor T16 is connected to the first shutdown control signal line, a first electrode thereof is connected to the output terminal Output n, and a second electrode thereof is connected to the second shutdown control signal line. In response to the shutdown signal, the potential of the first signal line Vdd is naturally discharged to a zero potential, and the first shutdown control signal line SHUTDOWN 1 is pulled up, and controls the shutdown control sub-circuit to output the second shutdown control signal inputted by the second shutdown control signal line to the output terminal, wherein after the potential of the second shutdown control signal is pulled up, control on the potential of the second shutdown control signal line can be disconnected, so that the second shutdown control signal line is naturally discharged to a zero potential.

In some embodiments, the first shutdown control signal line and the second shutdown control signal line may be a same signal line. For example, the shutdown control signal line can connect the gate of the shutdown control transistor T16 to its second electrode.

In some other embodiments, at least one of the first shutdown control signal line and the second shutdown control signal line can reuse other signal lines to which the shift register unit is connected. In this case, the first shutdown control signal line and the second shutdown control signal line can be different signal lines. For example, one of the first shutdown control signal line and the second shutdown control signal line can be the first clock signal line CLK1, and another thereof can be other signal lines (such as a frame input signal control line STV, a third signal line VSS or any other signal lines that would not output a high level at the same time as the first clock signal line CLK1 during normal operation of the shift register unit). For another example, one of the first shutdown control signal line and the second shutdown control signal line can be the frame input signal control line STV, and another thereof can be other signal lines (such as the first clock signal line CLK1, the third signal line VSS or any other signal lines that would not output a high level at the same time as the frame input signal control line STV during normal operation of the shift register unit).

In a state where the shift register unit operates normally, within a period of time during which the frame input signal control line STV is a high potential, the first clock signal line CLK1 is always a low level. Therefore, the shutdown control sub-circuit in a normal operation status would not influence the output terminal Output n.

In a shutdown procedure, when a shutdown Xon function is started up, the frame input signal control line STV and the clock signal line CLK are input high level signals at the same time, control the shutdown control transistor T16 to be turned on, and the output terminal Output n outputs a high level and discharges the pixel circuit. Similarly, respective stages of shift register units in the gate driving circuit output a high level at this time, and thus the input transistor T1 is turned on under the control of the input signal line Output n−1. At this time, the input signal line Vdd is not influenced by the shutdown procedure, and its potential is decreased gradually to a zero potential by discharging naturally, so that the pull-up node PU is discharged naturally along with the first signal line Vdd.

Upon power-on, as the input signal line of the first stage of shift register unit, the frame input signal control line STV is pulled up prior to the first clock signal line CLK1. Therefore, it does not have any effect on output terminals of other stages of shift register units, and thus would not influence normal operation of the gate driving circuit.

As described above, the shift register unit 400 according to the present disclosure is capable of effectively avoiding the output abnormality due to high potential of the pull-up node PU.

Figure 5:
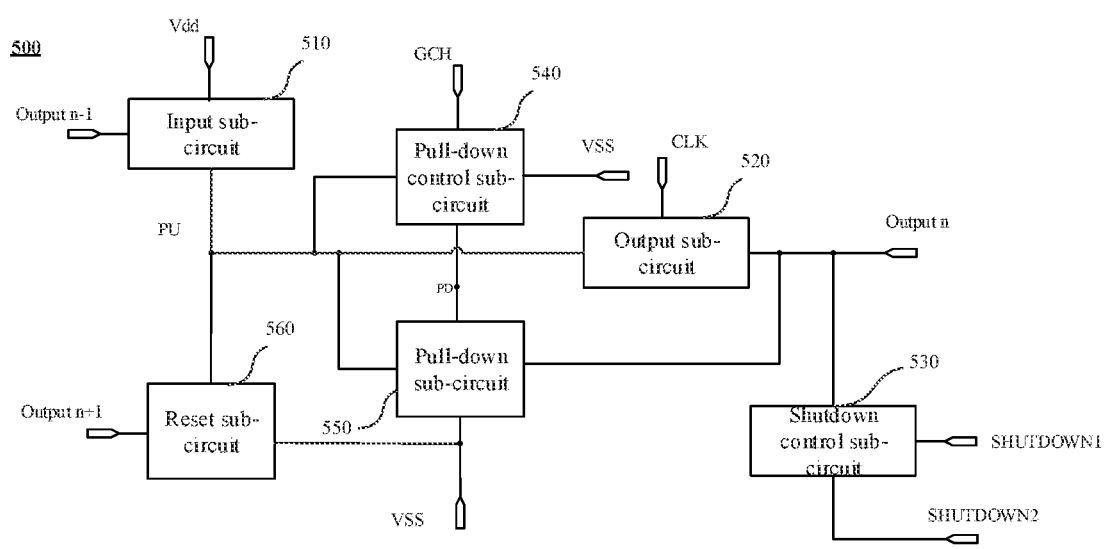
FIG. 5 is a schematic block diagram of a shift register unit according to some embodiments of the present disclosure.

FIG. 5 shows a schematic block diagram of a shift register unit according to some embodiments of the present disclosure. The input sub-circuit 510, the output sub-circuit 520, and the shutdown control sub-circuit 530 as shown in FIG. 5 have the same structure as the input sub-circuit 310, the output sub-circuit 320, and the shutdown control sub-circuit 330 as shown in FIG. 3, and thus no further details are given herein.

As shown in FIG. 5, the shift register unit 500 can further comprise: a pull-down control sub-circuit 540, having a first terminal connected to the pull-up node PU, a second terminal connected to the second signal line GCH, and a third terminal connected to the third signal line VSS, and configured to control the level of the pull-down node PD according to the level of the pull-up node PU, the second power supply signal inputted by the second signal line GCH and the third power supply signal inputted by the third signal line VSS.

The shift register unit 500 can further comprise: a pull-down sub-circuit 550, having a first terminal connected to the pull-down node PD, a second terminal connected to the pull-up node PU, a third terminal connected to the output terminal OUTPUT, and a fourth terminal connected to the third signal line VSS, and configured to pull down levels of the pull-up node PU and the output terminal to the third power supply signal of the third signal line VSS under the control of the pull-down node PD.

The shift register unit 500 can further comprise: a reset sub-circuit 560, having a first terminal connected to the reset signal line Output+1, a second terminal connected to the pull-up node PU, and a third terminal connected to the third signal line VSS, and configured to pull down the pull-up node PU to the third power supply signal of the third signal line VSS under the control of the reset signal line.

Figure 6:
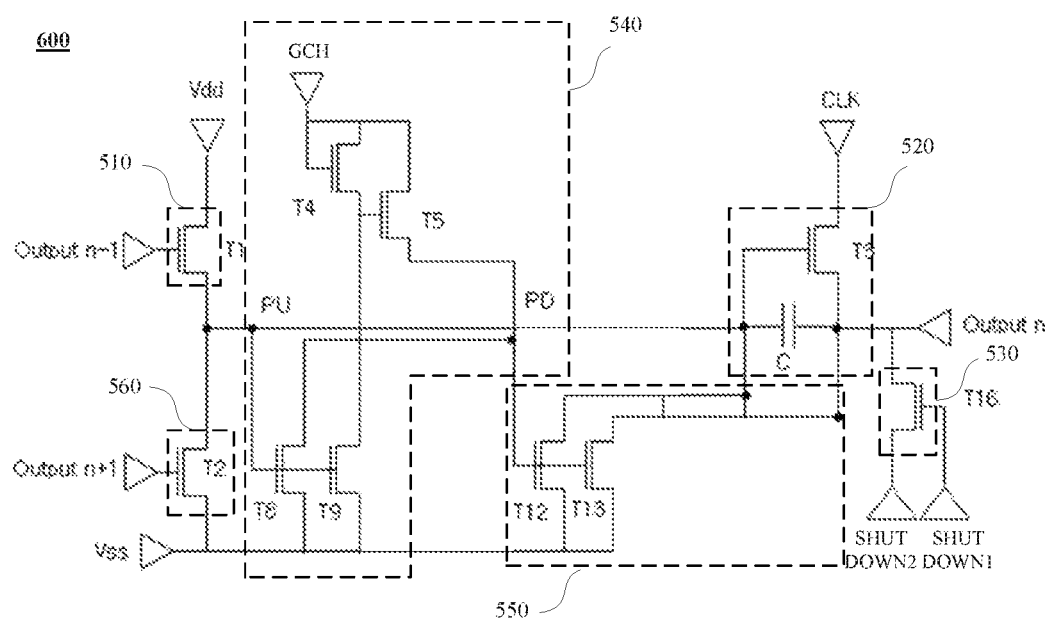
FIG. 6 is an exemplary circuit structure of a shift register unit according to some embodiments of the present disclosure.

FIG. 6 shows an exemplary circuit structure of a shift register unit according to some embodiments of the present disclosure. The circuit structure of the shift register unit will be described in detail by combining with FIGS. 5 and 6. Herein, the input sub-circuit 510, the output sub-circuit 520, and the shutdown control sub-circuit 520 have the same structure as the input sub-circuit 310, the output sub-circuit 320, and the shutdown control sub-circuit 330, and thus no further details are given herein.

As shown in FIG. 6, in one embodiment, the pull-down control sub-circuit 540 comprises a first pull-down control transistor T4, a second pull-down control transistor T5, a third pull-down control transistor T9, and a fourth pull-down control transistor T8, wherein a gate of the first pull-down control transistor T4 is connected with the first electrode and connected to the second signal line GCH, a second electrode thereof is connected to a gate of the second pull-down control transistor T5, and connected to a first electrode of the third pull-down control transistor T9; a first electrode of the second pull-down control transistor T5 is connected to the second signal line GCH, and a second electrode thereof is connected to the pull-down node PD; a gate of the third pull-down control transistor T9 is connected to the pull-up node PU, and a second electrode thereof is connected to the third signal line VSS; a gate of the fourth pull-down control transistor T8 is connected to the pull-down node PU, a first electrode thereof is connected to the pull-down node PD, and a second electrode thereof is connected to the third signal line VSS.

In one embodiment, the pull-down sub-circuit 550 comprises a first pull-down transistor T12 and second pull-down transistor T13, wherein a gate of the first pull-down transistor T12 is connected to the pull-down node PD, a first electrode thereof is connected to the pull-up node PU, and a second electrode thereof is connected to the third signal line VSS; a gate of the second pull-down transistor T13 is connected to the pull-down node PD, a first electrode thereof is connected to the output terminal Output n, and a second electrode thereof is connected to the third signal line VSS.

In one embodiment, the reset sub-circuit 560 comprises a reset transistor T2, wherein a gate of the reset transistor T2 is connected to the reset signal line, a first electrode thereof is connected to the pull-up node PU, and a second electrode thereof is connected to the third signal line VSS.

In the process of shutdown, the output terminal of the shift register unit 600 according to the present disclosure outputs a high level under the control of the shutdown control sub-circuit, and the first signal line Vdd, the second signal line GCH and the third signal line VSS are gradually decreased to a zero potential in a mode of discharging naturally. Since the pull-up node PU and the pull-down node PD are not affected by the shutdown control sub-circuit and output signals of respective stages of shift register units, potentials at the pull-up node PU and the pull-down node PD are discharged naturally, so as to avoid the output abnormality from occurring upon repower-on because the charges at the pull-up node PU and the pull-down node PD are not discharged timely.

Figure 7:
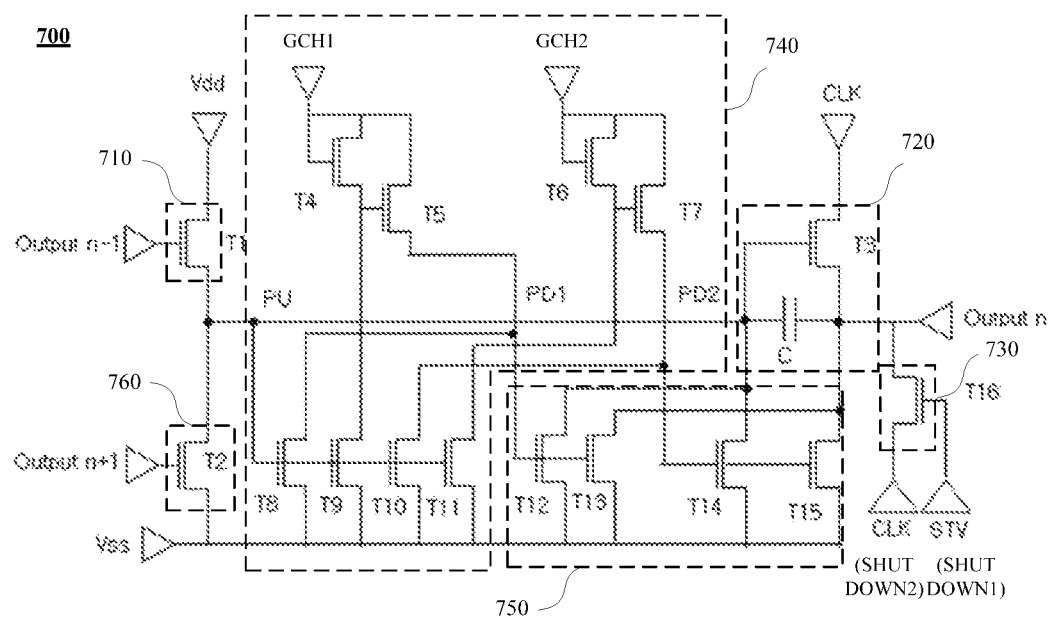
FIG. 7 is an exemplary circuit structure of a shift register unit according to some embodiments of the present disclosure.

FIG. 7 shows an exemplary circuit structure of a shift register unit according to some embodiments of the present disclosure. The circuit structure of the shift register unit will be described in detail by combining FIGS. 5, 6, and 7. Herein, the input sub-circuit 710, the output sub-circuit 720, the shutdown control sub-circuit 730, and the reset sub-circuit 760 as shown in FIG. 7 have a structure as the same as those shown in FIGS. 5 and 6, and thus no further details are given herein.

In one embodiment, in the shift register unit 700 as shown in FIG. 7, the pull-down control sub-circuit 740 comprises two sub-units having a same structure, wherein a first pull-down control sub-unit comprises a first pull-down control transistor T4, a second pull-down control transistor T5, a third pull-down control transistor T9, and a fourth pull-down control transistor T8, and a second pull-down control sub-unit comprises a first pull-down control transistor T6, a second pull-down control transistor T7, a third pull-down control transistor T11, and a fourth pull-down control transistor T10.

Similarly, the pull-down sub-circuit 750 comprises two sub-units having a same structure, wherein a first pull-down sub-unit comprises a first pull-down transistor T12 and a second pull-down transistor T13, and a second pull-down sub-circuit comprises a first pull-down transistor T14 and a second pull-down transistor T15.

As shown in FIG. 7, the first pull-down control sub-unit and the first pull-down sub-unit are mutually connected with each other via a first pull-down node PD1, and the second pull-down control sub-unit and the second pull-down sub-unit are mutually connected with each other via a second pull-down node PD2.

In the shift register unit as shown in FIG. 7, T4/T6, T5/T7, T9/T11, T8/T10, T12/T14, T13/T15 and signal lines GCH1/GCH2 form two sets of circuit structures having a same structure. In the driving process of the shift register unit, the signal line GCH1/GCH2 is applied a driving signal (such as high level) alternatively, that is, when GCH1 is input a high level, GCH2 is input a low level; when GCH 1 is input a low level, GCH 2 is input a high level. The above control method makes that the above two sets of same circuits realize a same circuit control function alternatively, so as to prevent drift of electrical characteristics from occurring in the transistors because of being in an operating state constantly.

Figure 8:
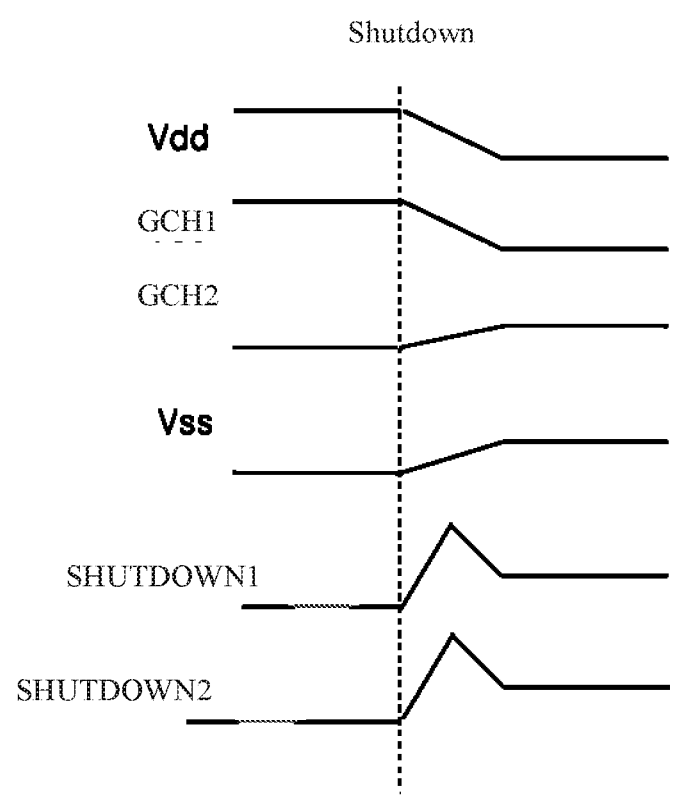
FIG. 8 is a shutdown timing diagram of a gate driving circuit according to some embodiments of the present disclosure.

FIG. 8 is a shutdown timing diagram of a gate driving circuit according to some embodiments of the present disclosure. This shutdown timing diagram can be applicable to the shift register unit shown in FIG. 7.

As shown in FIG. 8, when the shutdown procedure is activated, the first signal line Vdd, the second signal line GCH1/GCH2 and the third signal line Vss are decreased to the zero potential in a manner of being discharged naturally. The first shutdown control signal line and the second shutdown control signal line are gradually discharged to the zero potential after being pulled up to a high potential.

By applying the shutdown timing as shown in FIG. 8 to the shutdown procedure, in the shutdown process, respective stages of shift register units output a high potential via the output terminal under the control of the first shutdown control line SHUTDOWN1 and the second shutdown control line SHUTDOWN2. At the same time, since the first signal line Vdd, the second signal line GCH1/GCH2 and the third signal line Vss are decreased to the zero potential in a manner of being discharged naturally, the potentials of the pull-up node PU and the pull-down node PD are decreased naturally along with the first signal line Vdd, the second signal line GCH1/GCH2 and the third signal line Vss. In the case, output abnormality upon repower-on due to electric charges at the pull-up node PU and the pull-down node PD being not released timely can be avoided.

Figure 9:
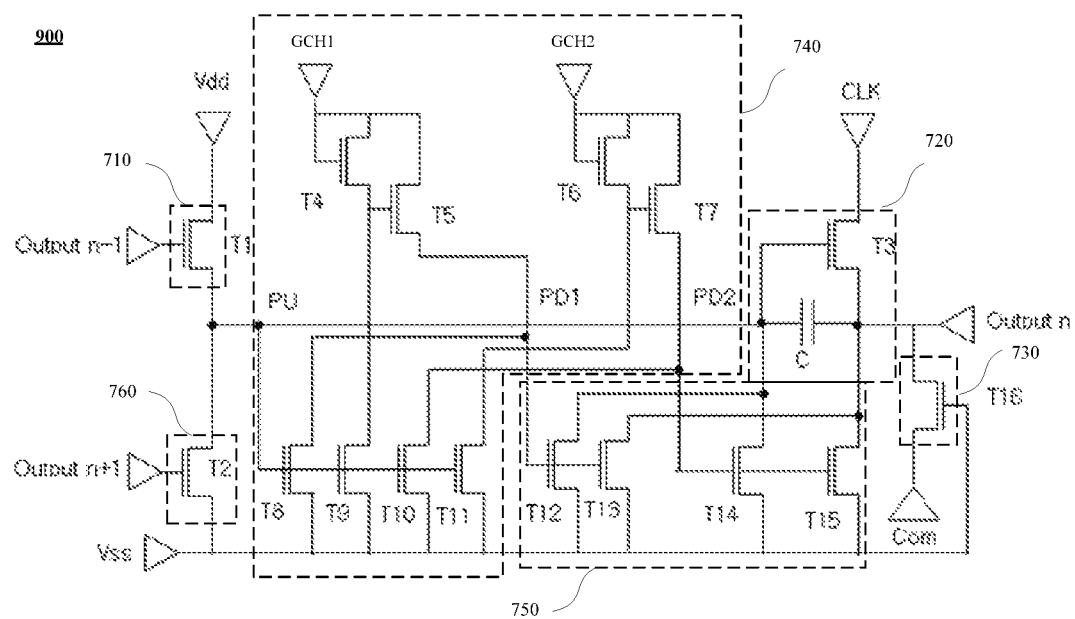
FIG. 9 is an exemplary circuit structure of a shift register unit according to some embodiments of the present disclosure.
Figure 10:
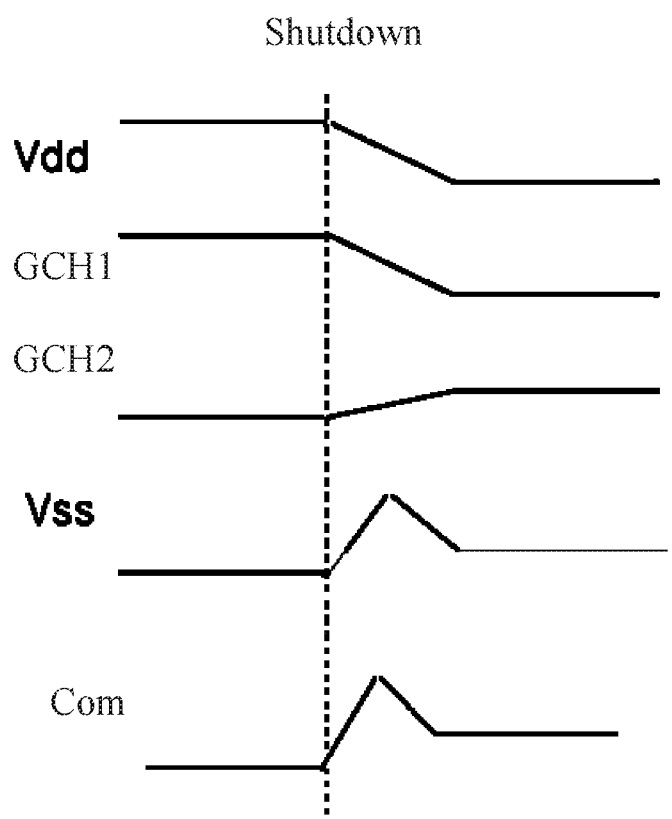
FIG. 10 is a shutdown timing diagram of a gate driving circuit according to some embodiments of the present disclosure.

FIG. 9 is an exemplary circuit structure of a shift register unit according to another embodiment of the present disclosure. Herein, the input sub-circuit 710, the output sub-circuit 720, the shutdown control sub-circuit 730, and the reset sub-circuit 760 as shown in FIG. 9 have a structure as the same as the structure as shown in FIG. 7, and thus no further details are given herein.

According to the exemplary circuit structure as shown in FIG. 9, the first shutdown control signal line can be a third signal line VSS, and the second shutdown control signal can be a fourth signal line Com. In the shutdown procedure, the fourth signal line Com and the third signal line VSS are gradually discharged to the zero potential after being pulled up to the high potential. At this time, by designing a channel width-to-length ratio between the input transistor T1 and the reset transistor T2, it can make that the pull-up node PU is gradually discharged along with the potential of the first signal line Vdd. The potential at the pull-up node PU would not rise along with the third signal line VSS, so as to avoid the output abnormality from occurring upon repower-on due to the electric charges at the pull-up node PU and the pull-down node PD being not released timely.

Figure 11:
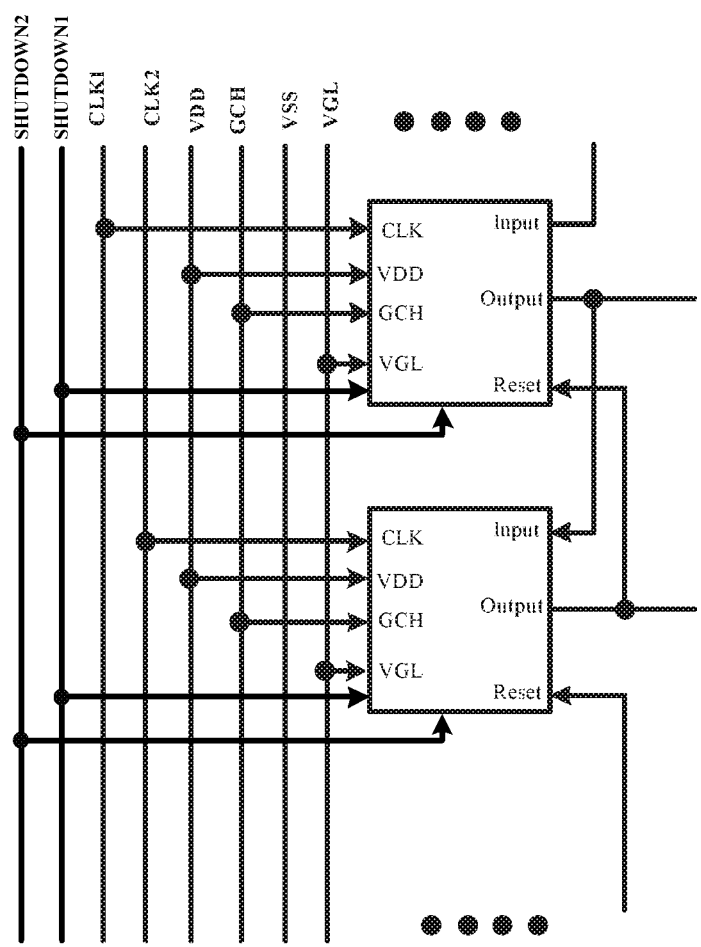
FIG. 11 is a schematic diagram of a gate driving circuit applying a shift register unit according to some embodiments of the present disclosure.

According to another aspect of the present disclosure, there is further provided a gate driving circuit. As shown in FIG. 11, the gate driving circuit comprises a plurality of stages of shift register units connected in cascades, wherein any stage or plurality of stages of shift register units can adopt the structure of the shift register unit as shown in one of FIGS. 3-7, and 9. For example, the plurality of stages of all shift register units connected in cascades in the gate driving circuit adopt the structure of the shift register unit as described above.

The shift register unit in the cascade structure of the shift register unit of the gate driving circuit as shown in FIG. 11 is connected to the first shutdown control signal line SHUTDOWN1 and the second shutdown control signal line SHUTDOWN2. In some embodiments, the first shutdown control signal line SHUTDOWN1 and the second shutdown control signal line SHUTDOWN2 can be a same shutdown control signal line. In some other embodiments, at least one of the first shutdown control signal line SHUTDOWN1 or the second shutdown control signal line SHUTDOWN2 can reuse other signal lines to which the shift register unit is connected. In this case, the first shutdown control signal line and the second shutdown control signal line can be different signal lines. For example, one of the first shutdown control signal line SHUTDOWN1 and the second shutdown control signal line SHUTDOWN2 can be the first clock signal line CLK1, and another thereof can be other signal lines (such as a frame input signal control line STV, a third signal line VSS or any other signal lines that would not output a high level at the same time as the first clock signal line CLK1 during normal operation of the shift register unit). For another example, one of the first shutdown control signal line SHUTDOWN1 and the second shutdown control signal line SHUTDOWN2 can be the frame input signal line STV, and another thereof can be other signal lines (such as the first clock signal line CLK1, the third signal line VSS or any other signal lines that would not output a high level at the same time as the frame input signal control line STV during normal operation of the shift register unit). In some other embodiments, the first shutdown control signal line SHUTDOWN2 or the second shutdown control signal line SHUTDOWN2 can be the third signal line VSS.

In addition, the cascade structure of respective stages of shift register units of the gate driving circuit as shown in FIGS. 11 and 2 are the same, and thus no further details are given herein.

Figure 12:
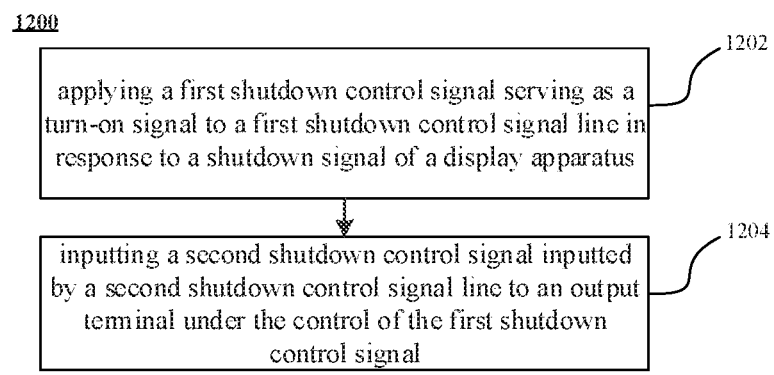
FIG. 12 is a flow diagram of a control method of a display apparatus of the present disclosure.

FIG. 12 is a flow diagram of a control method of a display apparatus according to the present disclosure. As shown in FIG. 12, the control method of the gate driving circuit according to the present disclosure comprises:

Step 1202: applying a first shutdown control signal serving as a turn-on signal to a first shutdown control signal line in response to a shutdown signal of the display apparatus;

Step 1204: inputting a second shutdown control signal inputted by a second shutdown control signal line to an output terminal under the control of the first shutdown control signal.

In step 1202, in response to the shutdown signal of the display apparatus (for example, after the user presses down the shutdown key), the first shutdown control signal serving as the turn-on signal is applied to the first shutdown control signal line SHUTDOWN1. For example, the shutdown control transistor T16 is turned on by inputting a signal at a high level through SHUTDOWN1.

In step 1204, the second shutdown control signal inputted by the second shutdown control signal line is inputted to the output terminal under the control of the first shutdown control signal. For example, a high level is applied to the second shutdown control signal line. As described above, the signal at a high level can be outputted via the output terminal of the stage of shift register unit through the shutdown control transistor T16 which is turned on under the control of the first shutdown control signal line. At the same time, for the present stage of shift register unit, except the input signal line Output n−1 output from a previous stage of shift register unit and the reset signal Output n+1 output from a next stage of shift register unit, all the other signal lines to which the shift register unit is connected can be discharged naturally to the zero potential, so that the potentials at the pull-up node PU and the pull-down node PD are discharged naturally along with the connected signal lines, thereby avoiding screen abnormality from occurring upon the next power-on because the potential at the pull-up node PU is pulled up in the shutdown procedure.

Unless otherwise defined, all the terms (including technical and scientific terms) used herein have same meaning commonly understood by those ordinary skilled in the art. It shall be understood that those terms defined in common dictionaries shall be explained as having meanings consistent with their meanings in the context of relative technology, but shall not be explained as idealized meanings or very formal meanings, unless otherwise explicitly defined herein.

The above are descriptions of the present disclosure, but shall not be deemed as limitations to the present disclosure. Although several exemplary embodiments of the present disclosure are described, it is easy for those skilled in the art to understand that many modifications and amendments can be made to exemplary embodiments without departing from novel teachings and advantages of the present disclosure. Therefore, all these amendments intend to be included within the scope of the present disclosure defined in the Claims. It shall be understood that the above are descriptions of the present disclosure but shall not be deemed as being limited to specific embodiments of the present disclosure. Furthermore, amendments made to the disclosed embodiments and other embodiments intend to be included within the scope of the attached Claims. The present disclosure is defined by the Claims and equivalents thereof.

What is claimed is:

1. A shift register unit, comprising:
   an input sub-circuit, having a first terminal connected to a first signal line, a second terminal connected to a pull-up node, and a third terminal connected to an input signal line;
   an output sub-circuit, having a first terminal connected to the pull-up node, a second terminal connected to a clock signal line, and a third terminal connected to an output terminal, and configured to output a clock signal inputted by the clock signal line to the output terminal under a control of the pull-up node;
   a shutdown control sub-circuit, having a first terminal connected to the output terminal, a second terminal connected to a first shutdown control signal line, and a third terminal connected to a second shutdown control signal line, wherein the shutdown control sub-circuit is configured to output a second shutdown control signal inputted by the second shutdown control signal line to the output terminal under a control of a first shutdown control signal,
   wherein the input sub-circuit is further configured to discharge a potential of the first signal line to a zero potential in response to a shutdown signal, and
   the shutdown control sub-circuit is further configured to pull up the first shutdown control signal line in response to the shutdown signal, and control the shutdown control sub-circuit to output the second shutdown control signal inputted by the second shutdown control signal line to the output terminal, wherein a potential of the second shutdown control signal is discharged to a zero potential after being pulled up.

2. The shift register unit according to claim 1, wherein one of the first shutdown control signal line and the second shutdown control signal line is the clock signal line.

3. The shift register unit according to claim 2, wherein another of the first shutdown control signal line and the second shutdown control signal line is a frame input signal control line.

4. The shift register unit according to claim 1, further comprising:
   a pull-down control sub-circuit, having a first terminal connected to the pull-up node, a second terminal connected to a second signal line, and a third terminal connected to a third signal line, and configured to control a level of a pull-down nod according to a level of the pull-up node, a first power supply signal inputted by the second signal line and a third power supply signal inputted by the third signal line;
   a pull-down sub-circuit, having a first terminal connected to the pull-down node, a second terminal connected to the pull-up node, a third terminal connected to the output terminal, and a fourth terminal connected to the third signal line, and configured to pull down levels of the pull-up node and the output terminal to the third power supply signal inputted by the third signal line under a control of the pull-down node;
   a reset sub-circuit, having a first terminal connected to a reset signal line, a second terminal connected to the pull-up node, and a third terminal connected to the third signal line, and configured to pull down the pull-up node to the third power supply signal inputted by the third signal line under a control of the reset signal line;
   wherein a potential of the third signal line is discharged to a zero potential in response to the shutdown signal.

5. The shift register unit according to claim 4, wherein one of the first shutdown control signal line and the second shutdown control signal line is the third signal line.

6. The shift register unit according to claim 1, wherein the shutdown control sub-circuit comprises a shutdown control transistor, having a gate connected to the first shutdown control signal line, a first electrode connected to the output terminal, and a second electrode connected to the second shutdown control signal line.

7. The shift register unit according to claim 1, wherein the input sub-circuit comprises an input transistor, wherein
   a gate of the input transistor is connected to the input signal line, a first electrode of the input transistor is connected to the first signal line, and a second electrode of the input transistor is connected to the pull-up node;

the output sub-circuit comprises an output transistor and an output capacitor, wherein a gate of the output transistor is connected with a first terminal of the output capacitor and connected to the pull-up node, and a first terminal of the output transistor is connected with a second terminal of the output capacitor and connected to the output terminal, and a second terminal of the output transistor is connected to the clock signal line.

8. The shift register unit according to claim 4, wherein the pull-down control sub-circuit comprises a first pull-down control transistor, a second pull-down control transistor, a third pull-down control transistor, and a fourth pull-down control transistor, wherein a gate of the first pull-down control transistor is connected with a first electrode of the first pull-down control transistor and connected to the second signal line, a second electrode of the first pull-down control transistor is connected to a gate of the second pull-down control transistor and connected to a first electrode of the third pull-down control transistor;

a first electrode of the second pull-down control transistor is connected to the second signal line, a second electrode of the second pull-down control transistor is connected to the pull-down node;

a gate of the third pull-down control transistor is connected to the pull-up node, and a second electrode of the third pull-down control transistor is connected to the third signal line;

a gate of the fourth pull-down control transistor is connected to the pull-up node, a first electrode of the fourth pull-down control transistor is connected to the pull-down node, and a second electrode of the fourth pull-down control transistor is connected to the third signal line;

the pull-down sub-circuit comprises a first pull-down transistor and a second pull-down transistor, wherein a gate of the first pull-down transistor is connected to the pull-down node, a first electrode of the first pull-down transistor is connected to the output terminal, and a second electrode of the first pull-down transistor is connected to the third signal line;

a gate of the second pull-down transistor is connected to the pull-down node, a first electrode of the second pull-down transistor is connected to the pull-up node, and second electrode of the second pull-down transistor is connected to the third signal line; and the reset sub-circuit comprises a reset transistor, wherein a gate of the reset transistor is connected to the reset signal line, a first electrode of the reset transistor is connected to the pull-up node, and a second electrode of the reset transistor is connected to the third signal line.

9. A display apparatus comprising a gate driving circuit, said gate driving circuit comprising N stages of shift register units connected in cascades, the shift register unit comprising:

an input sub-circuit, having a first terminal connected to a first signal line, a second terminal connected to a pull-up node, and a third terminal connected to an input signal line;

an output sub-circuit, having a first terminal connected to the pull-up node, a second terminal connected to a clock signal line, and a third terminal connected to an output terminal, and configured to output a clock signal inputted by the clock signal line to the output terminal under a control of the pull-up node;

a shutdown control sub-circuit, having a first terminal connected to the output terminal, a second terminal connected to a first shutdown control signal line, and a third terminal connected to a second shutdown control signal line, wherein the shutdown control sub-circuit is configured to output a second shutdown control signal inputted by the second shutdown control signal line to the output terminal under a control of a first shutdown control signal, wherein the input sub-circuit is further configured to discharge a potential of the first signal line to a zero potential in response to a shutdown signal, and the shutdown control sub-circuit is further configured to pull up the first shutdown control signal line in response to the shutdown signal, and control the shutdown control sub-circuit to output the second shutdown control signal inputted by the second shutdown control signal line to the output terminal, wherein a potential of the second shutdown control signal is discharged to a zero potential after being pulled up, an input terminal of an i-th stage of shift register unit is connected to an output terminal of an (i−1)-th stage of shift register unit, an output terminal of the i-th stage of shift register unit is connected to a reset terminal of the (i−1)-th stage of shift register unit, where N is an integer greater than 2, $1<i\leq N$;

an input terminal of a first stage of shift register unit is connected to a frame input signal control line;

a reset terminal of a N-th stage of shift register unit is connected to a frame reset signal control line.

10. A control method applicable to a display apparatus comprising a gate driving circuit, said gate driving circuit comprising N stages of shift register units connected in cascades, the shift register unit comprising:

an input sub-circuit, having a first terminal connected to a first signal line, a second terminal connected to a pull-up node, and a third terminal connected to an input signal line;

an output sub-circuit, having a first terminal connected to the pull-up node, a second terminal connected to a clock signal line, and a third terminal connected to an output terminal, and configured to output a clock signal inputted by the clock signal line to the output terminal under a control of the pull-up node;

a shutdown control sub-circuit, having a first terminal connected to the output terminal, a second terminal connected to a first shutdown control signal line, and a third terminal connected to a second shutdown control signal line, wherein the shutdown control sub-circuit is configured to output a second shutdown control signal inputted by the second shutdown control signal line to the output terminal under a control of a first shutdown control signal, wherein the input sub-circuit is further configured to discharge a potential of the first signal line to a zero potential in response to a shutdown signal, and the shutdown control sub-circuit is further configured to pull up the first shutdown control signal line in response to the shutdown signal, and control the shutdown control sub-circuit to output the second shutdown control signal inputted by the second shutdown control signal line to the output terminal, wherein a potential of the second shutdown control signal is discharged to a zero potential after being pulled up, an input terminal of an i-th stage of shift register unit is connected to an output terminal of an (i−1)-th stage of shift register unit, an output terminal of the i-th stage of shift register unit is connected to a reset terminal of the (i−1)-th stage of shift register unit, where N is an integer greater than 2, 1<i≤N;

an input terminal of a first stage of shift register unit is connected to a frame input signal control line;

a reset terminal of a N-th stage of shift register unit is connected to a frame reset signal control line, said control method comprising:

applying a first shutdown control signal serving as a turn-on signal to a first shutdown control signal line, in response to a shutdown signal of the display apparatus; and inputting a second shutdown control signal inputted by a second shutdown control signal line to an output terminal under the control of the first shutdown control signal.

11. The control method according to claim 10, wherein the shutdown control sub-circuit comprises a shutdown control transistor, having a gate connected to the first shutdown control signal line, a first electrode connected to the output terminal, and a second electrode connected to the second shutdown control signal line, wherein inputting the second shutdown control signal inputted by the second shutdown control signal line to the output terminal under the control of the first shutdown control signal comprises:

turning on the shutdown control transistor under a control of the first shutdown control signal, and outputting the second shutdown control signal inputted by the second shutdown control signal line to the output terminal, wherein a potential of the second shutdown control signal is discharged to a zero potential after being pulled up.

12. The display apparatus according to claim 9, wherein one of the first shutdown control signal line and the second shutdown control signal line is the clock signal line.

13. The display apparatus according to claim 12, wherein another of the first shutdown control signal line and the second shutdown control signal line is a frame input signal control line.

14. The display apparatus according to claim 9, wherein the shift register unit further comprises:

a pull-down control sub-circuit, having a first terminal connected to the pull-up node, a second terminal connected to a second signal line, and a third terminal connected to a third signal line, and configured to control a level of a pull-down nod according to a level of the pull-up node, a first power supply signal inputted by the second signal line and a third power supply signal inputted by the third signal line;

a pull-down sub-circuit, having a first terminal connected to the pull-down node, a second terminal connected to the pull-up node, a third terminal connected to the output terminal, and a fourth terminal connected to the third signal line, and configured to pull down levels of the pull-up node and the output terminal to the third power supply signal inputted by the third signal line under a control of the pull-down node;

a reset sub-circuit, having a first terminal connected to a reset signal line, a second terminal connected to the pull-up node, and a third terminal connected to the third signal line, and configured to pull down the pull-up node to the third power supply signal inputted by the third signal line under a control of the reset signal line;

wherein a potential of the third signal line is discharged to a zero potential in response to the shutdown signal.

15. The display apparatus according to claim 14, wherein one of the first shutdown control signal line and the second shutdown control signal line is the third signal line.

16. The display apparatus according to claim 9, wherein the shutdown control sub-circuit comprises a shutdown control transistor, having a gate connected to the first shutdown control signal line, a first electrode connected to the output terminal, and a second electrode connected to the second shutdown control signal line.

17. The display apparatus according to claim 9, wherein the input sub-circuit comprises an input transistor, wherein a gate of the input transistor is connected to the input signal line, a first electrode of the input transistor is connected to the first signal line, and a second electrode of the input transistor is connected to the pull-up node; and the output sub-circuit comprises an output transistor and an output capacitor, wherein a gate of the output transistor is connected with a first terminal of the output capacitor and connected to the pull-up node, and a first terminal of the output transistor is connected with a second terminal of the output capacitor and connected to the output terminal, and a second terminal of the output transistor is connected to the clock signal line.

\* \* \* \* \*